(12) United States Patent
Moshe

(10) Patent No.: US 10,800,599 B1
(45) Date of Patent: Oct. 13, 2020

(54) CASING FOR TRANSPORTING COMMUNICATIONS COMPUTERS AND ELECTRONICS RACKS

(71) Applicant: Doron Moshe, Pishon Lezion (IL)

(72) Inventor: Doron Moshe, Pishon Lezion (IL)

(*) Notice: Subject to any disclaimer, the term of this patent is extended or adjusted under 35 U.S.C. 154(b) by 172 days.

(21) Appl. No.: 16/303,675

(22) PCT Filed: Jun. 26, 2017

(86) PCT No.: PCT/IL2017/050710
§ 371 (c)(1),
(2) Date: Nov. 21, 2018

(87) PCT Pub. No.: WO2018/002919
PCT Pub. Date: Jan. 4, 2018

(30) Foreign Application Priority Data

Jun. 28, 2016 (IL) .......................................... 246517

(51) Int. Cl.
*B65D 85/30* (2006.01)
*B65D 81/127* (2006.01)
*H05K 7/14* (2006.01)

(52) U.S. Cl.
CPC ........... *B65D 85/30* (2013.01); *B65D 81/127* (2013.01); *H05K 7/1488* (2013.01)

(58) Field of Classification Search
None
See application file for complete search history.

(56) References Cited

U.S. PATENT DOCUMENTS

| 5,842,424 | A  |    | 1/1998  | Prevot    |             |
|-----------|----|----|---------|-----------|-------------|
| 5,921,644 | A  | *  | 7/1999  | Brunel    | G11B 33/124 |
|           |    |    |         |           | 312/223.2   |
| 7,757,349 | B2 | *  | 7/2010  | Laursen   | H04Q 1/09   |
|           |    |    |         |           | 16/358      |
| 8,109,581 | B1 | *  | 2/2012  | Lazenby   | A47B 88/90  |
|           |    |    |         |           | 312/311     |
| 9,332,670 | B1 |    | 3/2016  | Eichekberg |            |
| 9,433,114 | B2 | *  | 8/2016  | Hilburn   | H05K 7/186  |
| 9,433,118 | B2 | *  | 8/2016  | Senatori  | G06F 1/187  |
| 9,962,020 | B2 | *  | 5/2018  | Young     | A47B 81/00  |
| 10,343,814| B2 | *  | 7/2019  | Ziemer    | B65D 61/00  |
| 2001/0026436 | A1 | * | 10/2001 | Tanzer  | H01R 25/006 |
|           |    |    |         |           | 361/610     |
| 2003/0205955 | A1 | * | 11/2003 | Egger   | A47B 88/43  |
|           |    |    |         |           | 312/334.5   |
| 2004/0228098 | A1 | * | 11/2004 | Robbins | H01R 25/006 |
|           |    |    |         |           | 361/725     |
| 2008/0007019 | A1 |   | 10/2008 | Sparkowski |          |
| 2009/0316350 | A1 | * | 12/2009 | Hu      | H05K 5/03   |
|           |    |    |         |           | 361/679.33  |
| 2012/0001529 | A1 | * | 1/2012  | Rahilly | A47B 61/02  |
|           |    |    |         |           | 312/334.1   |
| 2012/0120611 | A1 | * | 5/2012  | Ni      | H05K 7/1494 |
|           |    |    |         |           | 361/727     |
| 2013/0214105 | A1 | * | 8/2013  | Herder  | F16M 13/02  |
|           |    |    |         |           | 248/205.1   |

(Continued)

*Primary Examiner* — Xanthia C Cunningham

(57) ABSTRACT

A casing for transporting communications racks that includes a box and a metal bottom that equipped with four detachable horizontal arms. The arms are designed to be connected and disconnected to four corners of the metal bottom. The gap between the arms to the end of the rail in the metal bottom includes a sponge for absorbing external forces.

3 Claims, 5 Drawing Sheets

(56) References Cited

U.S. PATENT DOCUMENTS

| | | | |
|---|---|---|---|
| 2014/0116970 A1* | 5/2014 | Hsu | H05K 7/1488 |
| | | | 211/26 |
| 2014/0234949 A1* | 8/2014 | Wasson | G01N 35/00871 |
| | | | 435/287.2 |
| 2015/0130339 A1 | 5/2015 | Barnett | |
| 2015/0296982 A1* | 10/2015 | Chen | A47B 88/43 |
| | | | 312/334.8 |
| 2016/0157385 A1 | 2/2016 | Chan et al. | |
| 2016/0128474 A1* | 5/2016 | Chen | A47B 88/969 |
| | | | 312/333 |

* cited by examiner

CASING FOR TRANSPORTING COMMUNICATIONS COMPUTERS AND ELECTRONICS RACKS

RELATED APPLICATIONS

This application is a National Phase of PCT Patent Application No. PCT/IL2017/050710 having International filing date of 26 Jun. 2017, which claims the benefit of priority of Israeli patent application number 246517 filed on 28 Jun. 2016. The contents of the above applications are all incorporated by reference as if fully set forth herein in their entirety.

TECHNICAL FIELD

The present invention relates to a casing for transporting communications computers and electronics racks that includes a metal bottom, four detachable horizontal arms that are designed to absorb external forces.

BACKGROUND ART

The methods and means known today for transporting communications computers and electronics racks ("communication racks") have a number of problems. First, it should be understood that communication racks are very expensive items, very sensitive when they fall and in many cases very heavy. For example, there are racks of 200 cm height; 90 cm long, 60 cm wide, weighing between 200 and 2,500 kg and in a value of between One Hundred Thousands to Two million USD. Sometimes it is necessary to transport the communication rack in a standing position, and as a result it is unstable due to its weight and a relatively high center of gravity. It is customary to pack the communication rack in a wooden casing that is generally compatible with the size of the communication rack, to transport it from the manufacturer to the customer, and sometimes it is transported between countries in containers on ships.

Increasing the bottom area of the casing in a manner that does not match the bottom area of the communication rack itself may be a solution for this problem. However, this is an expensive solution as the payment for transportation is usually determined according to the volume of the case. The present invention discloses an efficient and relatively inexpensive solution to the problem mentioned above, in that it describes an advanced casing for transporting communication racks.

DESCRIPTION OF THE DRAWINGS

The intention of the drawings attached to the application is not to limit the scope of the invention and its application. The drawings are intended only to illustrate the invention and they constitute only one of its many possible implementations.

THE INVENTION

The main objective of the present invention is to provide a casing for transporting communications racks (1) that includes a relatively heavy metal bottom (2) that equipped with four detachable horizontal arms (3), that increase the stability of the casing without increasing its total volume. Another objective of the present invention is to provide a unique connecting method that provides flexibility of these four detachable horizontal arms and their ability to absorb external forces without being damaged.

Figure 1:
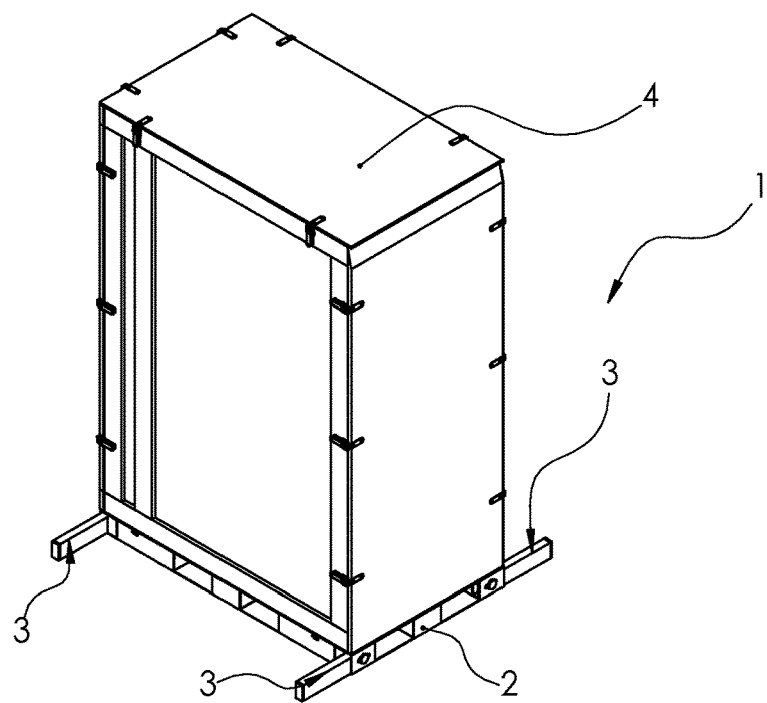
FIG. 1 depicts the casing (1) that includes a box (4), metal bottom (2) and four detachable horizontal arms (3).
Figure 2:
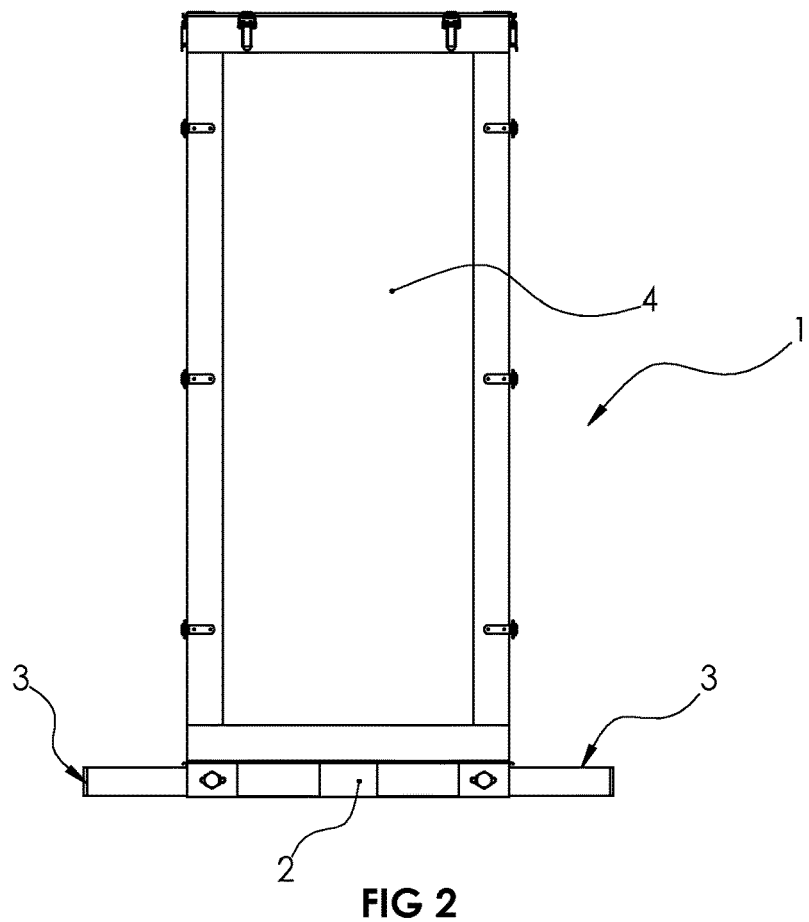
FIG. 2 is a side view of the casing (1).
Figure 3:
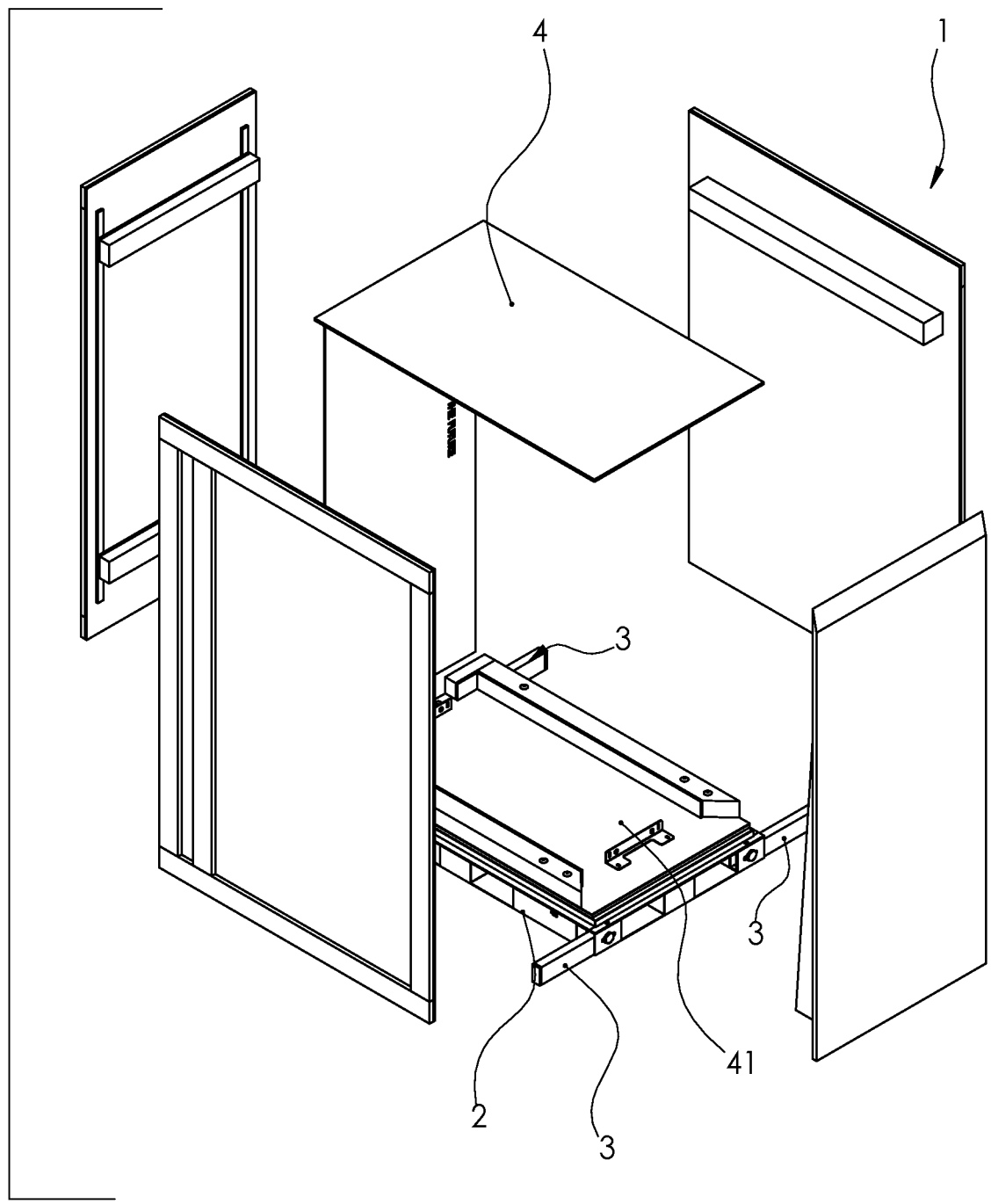
FIG. 3 is an exploded view of the casing (1) that includes the box (4) in a disassembled state.
Figure 4:
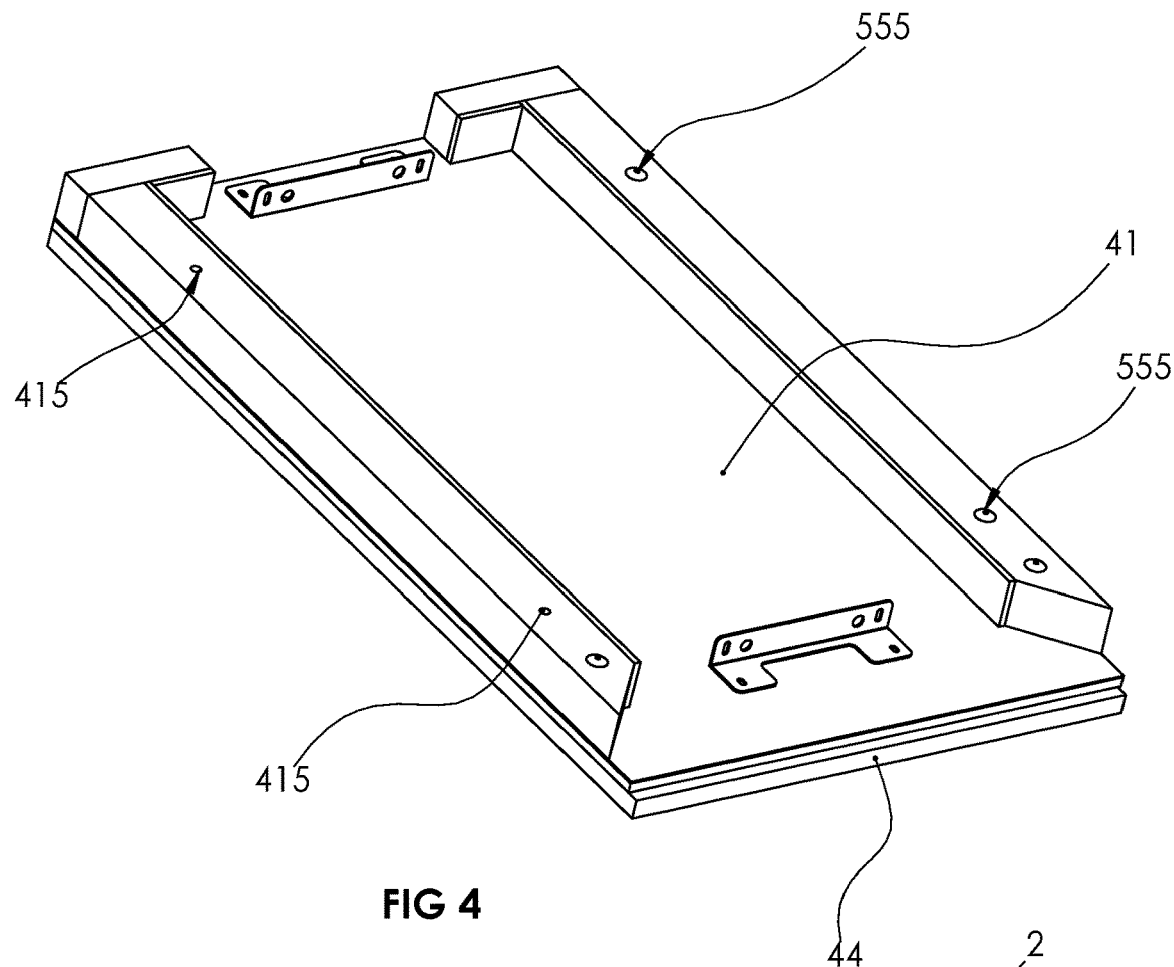
FIG. 4 depicts the bottom wall (41) of the box (4).

The casing for transporting communications racks (1) includes a box (4) in which the communication rack is located while transporting it and a relatively heavy metal bottom (2) that equipped with four detachable horizontal arms (3) that are designed to increase the stability of the casing (1). The box (4) is generally designed as a standard box for transportation of communication racks that are usually made of wooden plates and shaped like a square box. FIG. 1 describes the casing (1) that includes the box (4), the metal bottom (2) and the four detachable horizontal arms (3). FIG. 2 is a side view of the casing (1). FIG. 3 is an exploded view of the casing (1) that includes the box (4) in a disassembled state. The box (4) includes four peripheral walls, an upper wall and a bottom wall (41), which is described in FIGS. 3 and 4.

Figure 5:
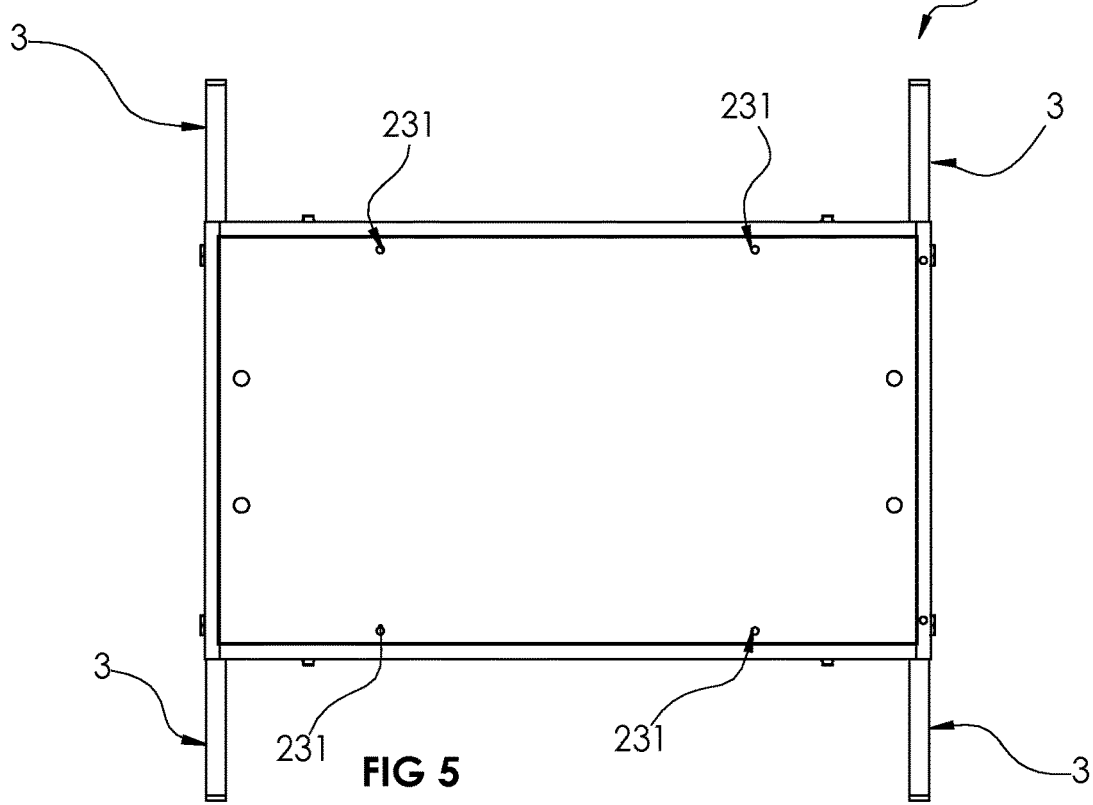
FIG. 5 is a perspective view of the metal bottom (2).

The metal bottom (2) is attached to the bottom wall (41) of the box (4). This connection can be carried out in a variety of known means and methods in the field. The metal bottom (2), as its name indicates, is made of metal, and as a result it lowers the center of gravity of the casing (1) and increases the stability of the casing without increasing its volume. FIG. 5 depicts the metal bottom (2) in perspective.

The metal bottom (2) includes, as stated above, four detachable horizontal arms (3) that protrude from the four corners of the metal bottom (2). The arms (3) are detachable in the sense that they can be mounted to the corners of the metal bottom (2) when the communication rack is packaged in the casing (1) and can be disassembled and detachable when the openings through which the casing should be transport are relatively narrow.

Figure 6:
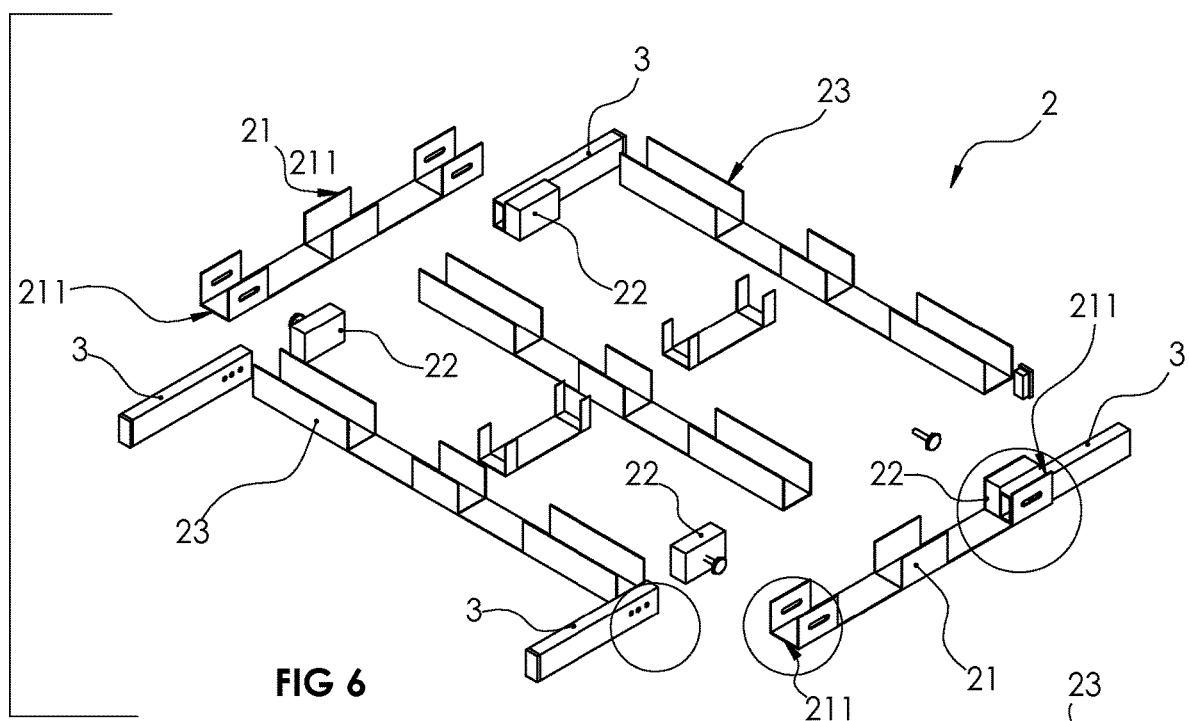
FIG. 6 is an exploded view of the metal bottom (2) in a disassembled state.
Figure 8:
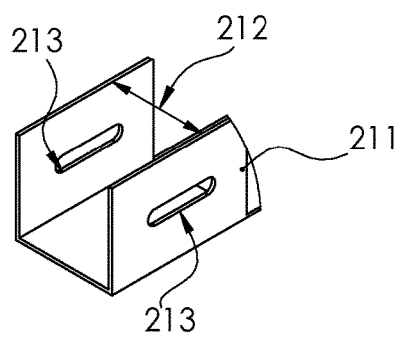
FIG. 8 depicts the end of the rail (211), the arm (3) and the sponge (22).
Figure 10:
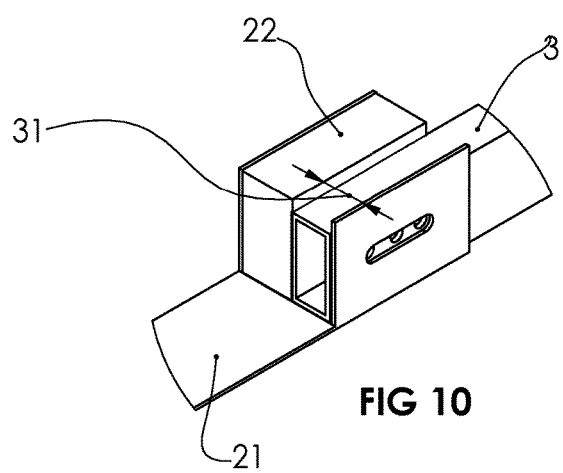
FIG. 10 depicts the way that the arm (3) and the sponge (22) are integrated in the rail (21).

The metal bottom (2) may be made of several parts as described for example in FIG. 6 which is an exploded diagram of the metal bottom (2) in a disassembled state. It is possible that the metal bottom (2) will be composed differently than described in the figures. The metal bottom (2) also includes a pair of rails (21) that can be used as the sides of the metal bottom. Each rail has two ends (211). In this manner, the metal bottom (2) consists of four ends (211) to which the four arms (3) are attached. FIG. 6 shows the pair of rails (21), each of which has two ends (211). It is desirable and possible that the width (212) of each end (211) be larger than the width (31) of the arms (3) as described for example in FIG. 8. Thus, when the arm (3) is integrated at the end (211) of the rail (21), there is a gap between the width of the end of the rail (212) and the width of the arm (31). A piece of sponge (22) is inserted in this gap, which is squeezed between the inner wall of the end of the rail (211) and the arm (3), as shown for example in FIG. 10.

Figure 7:
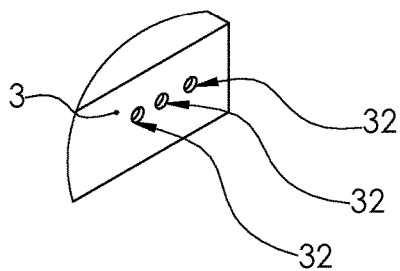
FIG. 7 depicts the manner in which the arm (3) is integrated in the end of the rail (211).
Figure 11:
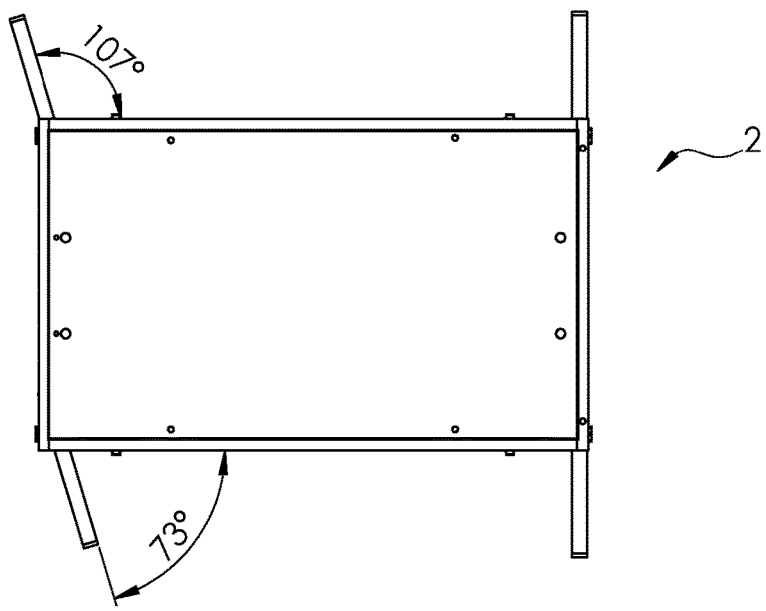
FIGS. 11 and 12 illustrate the arm (3) that is integrated in the metal bottom (2) in a tilt state.
Figure 12:
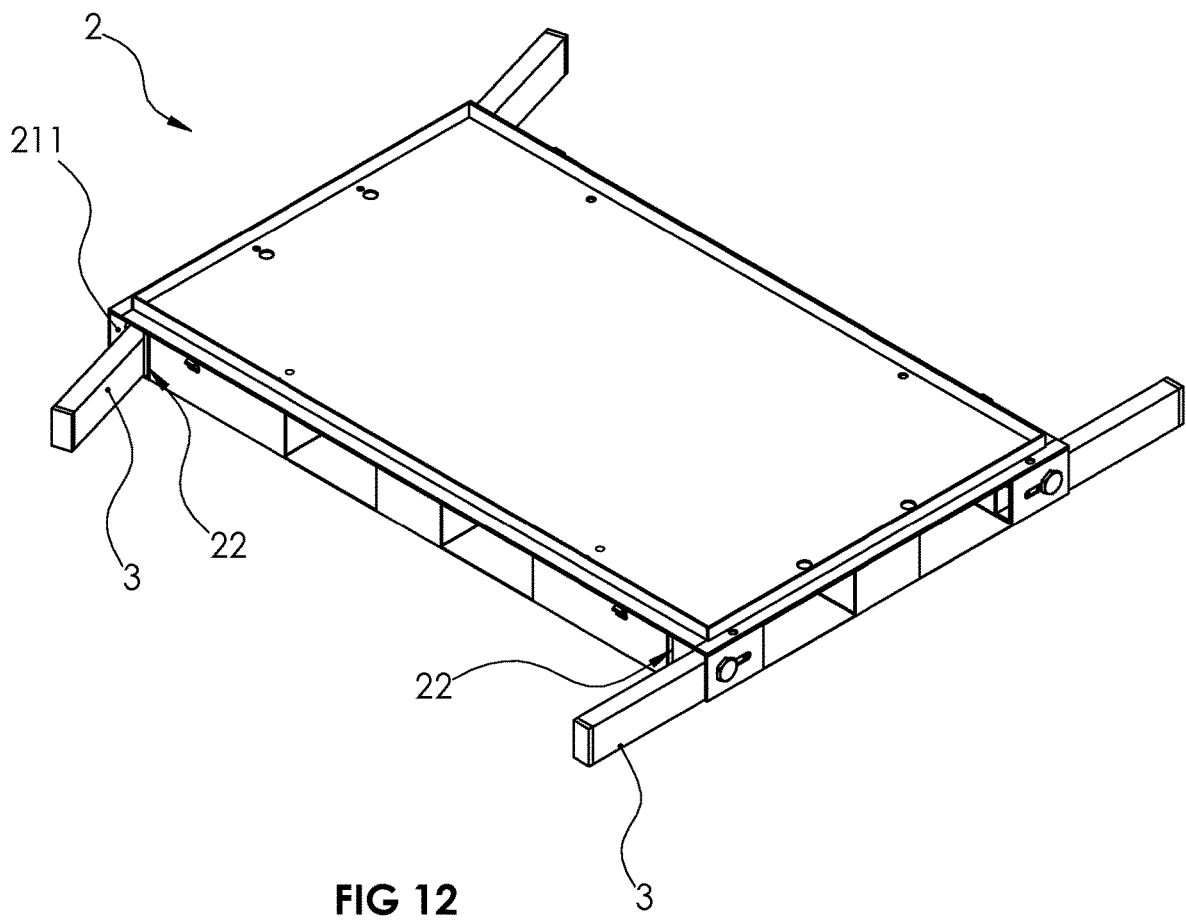

The arm (3) and the sponge (22) can be connected to the end of the rail (211) by means of screw, pin and the like. It is desirable that the end of the rail (211) should include a longitudinal groove (213), instead of a circular hole as is customary. In addition, the end of the arm includes a circular hole (32), and desirable a several holes to control the length of the arm (3) that will protrude from the metal bottom (2) as described for example in FIG. 7. This method of connection as described above is intended to maintain the integrity of the arms (3), so that if in the event of transport a forklift or any other body severely hits the arm (3), then the arm will not bend and it will maintain the integrity of its shape. In such case, the arm (3) will be tilted while retaining its integrity of its shape and slightly smoothest the piece of sponge (22) as illustrated in FIGS. 11 and 12. The fact that the screw that connects the arm (3) to the end of the rail (211) is locked in a longitudinal slot (213) and not in a circular hole enables the screw a relatively easy movement and freedom to enables the aforementioned tilting of the arm (3).

Figure 9:
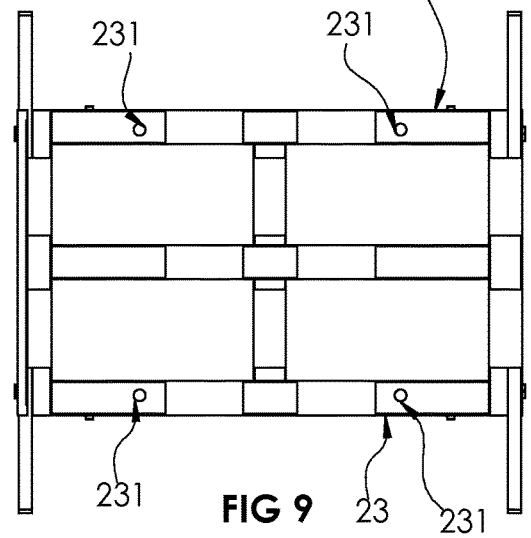
FIG. 9 depicts the metal bottom (2) that includes sides (23) and holes (231).

To the bottom side of the bottom wall (41) is attached a sponge sheet (44) which is attached to the metal bottom (2). These attachments can be applied through adhesives. When the communication rack is connected to and on the bottom wall (41) then the transport shocks are absorbed by the sponge sheet (44). In order to avoid the removing of the sponge sheet from said adhesive, the inventor added a number of screws to prevent possible removal of the sponge sheet (44) from the bottom wall (41) or from the metal bottom (2). Therefore, the bottom wall (41) includes several holes (415) and also the pair of sides (23) of the metal bottom (2) includes matching holes (231), as shown for example in FIG. 9, and by using screws (555) is it possible to ensure the attachment of the bottom wall (41) to the metal bottom (2). It is clear that these screws (555) should be in a floating connection, that is, to allow relative movement between the bottom wall (41) and the metal bottom (2) as part of shock absorption.

What is claimed is:

1. A casing for transporting communications racks that includes a box and a metal bottom that equipped with four detachable horizontal arms; wherein the box includes four peripheral walls, upper wall and bottom wall; wherein the box is designed to contain a communication rack during transportation; wherein the four detachable horizontal arms are designed to be connected and disconnected to four corners of said metal bottom; wherein the metal bottom includes a pair of rails that each of them has two ends; wherein each of said four detachable horizontal arms is designed to be connected and protrude and disconnected to each of said corners of said rails; wherein the width of each end of said rails is larger than the width each of said arms wherein when said four detachable horizontal arms are integrated at the ends of said rails, there is a gap that is designed to receive a piece of sponge which is squeezed between the inner wall of the end of the rail and the detachable horizontal arm; wherein said metal bottom lowers the center of gravity of said casing and increases its stability; wherein when said four detachable horizontal arms are connected to said metal bottom they increase the stability of the casing without increasing its total volume; wherein said piece of sponge enables flexibility of said detachable horizontal arm and absorbs external forces.

2. The casing for transporting communications racks according to claim 1 that said end of said rail further includes a longitudinal groove that enables tilting of a screw that connects said detachable horizontal arm with said end of said rail.

3. The casing for transporting communications racks according to claim 1 that further includes a sponge sheet that attached between said bottom wall to to said metal bottom for absorbing transport shocks during transportation.

\* \* \* \* \*